(12) United States Patent
Muenter et al.

(10) Patent No.: US 7,561,091 B1
(45) Date of Patent: Jul. 14, 2009

(54) ANALOG TO DIGITAL CONVERTER WITH DYNAMICALLY RECONFIGURABLE CONVERSION RESOLUTION

(75) Inventors: Steven Edward Muenter, Van Nuys, CA (US); Kenneth J. Carrillo, Simi Valley, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/968,917

(22) Filed: Jan. 3, 2008

(51) Int. Cl.
*H03M 1/66* (2006.01)
(52) U.S. Cl. .................................. 341/155; 341/122
(58) Field of Classification Search ................. 341/155, 341/122, 159, 161, 167
See application file for complete search history.

(56) References Cited

U.S. PATENT DOCUMENTS

| | | | |
|---|---|---|---|
| 5,084,704 A | 1/1992 | Parrish | |
| 5,801,657 A | 9/1998 | Fowler et al. | |
| 7,068,205 B1 * | 6/2006 | Hastings et al. | ............. 341/164 |
| 7,313,380 B2 * | 12/2007 | Yamaji | ........................ 455/264 |
| 7,443,333 B2 * | 10/2008 | Garrity et al. | ................ 341/163 |

OTHER PUBLICATIONS

U.S. Appl. No. 11/968,782, filed Jan. 30, 2007, Muenter et al.
Yang et al., "A Nyquist-Rate Pixel-Level ADC for CMOS Image Sensors", IEEE Journal of Solid-State Circuits, vol. 34, No. 3, Mar. 1999, pp. 348-356, Santa Clara, California.

* cited by examiner

*Primary Examiner*—Brian Young
(74) *Attorney, Agent, or Firm*—Yee & Associates, P.C.; Charles S. Gumpel

(57) ABSTRACT

A method and apparatus for an analog to digital converter with dynamically reconfigurable conversion resolution. The analog to digital converter comprises a sample and hold circuit, a controller, and a single, one-bit converter stage. The sample and hold circuit holds an input analog signal to form a captured analog signal. The controller determines a number of digital output bits required to generate digital output at a user defined conversion resolution. The one-bit converter stage processes an instance of a captured analog signal to generate an output bit. The controller iteratively processes a residue voltage through the one-bit converter stage a number of times required to generate the number of digital output bits to form a digital output with the user defined conversion resolution.

19 Claims, 8 Drawing Sheets

ANALOG TO DIGITAL CONVERTER WITH DYNAMICALLY RECONFIGURABLE CONVERSION RESOLUTION

CROSS-REFERENCE TO RELATED APPLICATIONS

The present disclosure is related to the following application entitled Focal Plane Array with Serial, Variable Bit Width Analog to Digital Converter, application Ser. No. 11/968,782, filed on Jan. 3, 2008, assigned to a common assignee and incorporated herein by reference.

BACKGROUND INFORMATION

1. Field

The present disclosure relates generally to analog to digital converters and in particular to a method and apparatus for converting analog input into digital output. More particularly, the present application is directed to a method and apparatus for analog to digital converters with dynamically reconfigurable conversion resolution.

2. Background

An analog signal is a time continuous signal having some varying feature of the signal that conveys information. A digital signal conveys information using discrete values rather than variations in a continuous signal. An analog to digital converter (ADC) is a device that converts an input analog voltage to a digital output.

There are currently many existing topologies for analog to digital converters. Each analog to digital converter topology is specifically configured for the number of bits of resolution generated during the conversion. The bit resolution of a digital signal refers to the bit depth or level of detail in the discrete, sampled digital signal output.

Although analog to digital converters generate the conversion data in parallel "N" bit wide format, a parallel to serial converter function is often included to simplify the electronic interface. Manufacturers of analog to digital converters will often produce multiple parts within the same family with different numbers of bits of resolution. Typical converter resolutions are 8 bit, 10 bit, 12 bit, 14 bit, 20 bit, and so forth using serial output computer buses, such as serial peripheral interface (SPI) or inter-integrated circuit (I2C). The pinouts of these analog to digital converters are standardized and allow interchangeability of parts. Thus, if a user wishes to change the bit resolution of serial digital output generated by an analog to digital converter, the user manually changes the parts having a first number of bits of resolution with parts that will produce output having a different number of bits of resolution. In this manner, the user can manually replace analog to digital converter parts with parts in the same family that has the identical electronic interface but produces a different number of bits of resolution.

The task of manually replacing parts associated with analog to digital converters each time a user wants to change the bit resolution of output digital signal is cumbersome, time consuming, and inefficient. Moreover, analog to digital converters with higher resolution often require a longer conversion period between the time that the analog voltage is sampled and the digital data is available for readout. Since analog to digital converters are often used in digital control loops, any latency during the conversion process is detrimental to the frequency response of the loop.

Trading resolution for speed requires physically replacing the analog to digital converter. In other words, if it is desirable to lower the resolution for the sake of increasing the conversion speed, the user may have to manually replace the higher resolution analog to digital converter with a lower resolution analog to digital converter. Also, high speed analog to digital converters frequently require significant amounts of electronic circuitry and consume a significant amount of power as compared to slower analog to digital converters.

Accordingly, there is a need for a method and apparatus for an analog to digital converter with dynamically reconfigurable conversion resolution, which overcomes the problems discussed above. Embodiments of the disclosure are intended to satisfy this need.

SUMMARY

An embodiment of the present disclosure provides an analog to digital converter with dynamically reconfigurable conversion resolution. The analog to digital converter comprises a sample and hold circuit, a controller, and a single, one-bit converter stage. The sample and hold circuit holds an input analog signal to form a captured analog signal. The controller determines a number of digital output bits required to generate digital output at a user defined conversion resolution. The one-bit converter stage processes the captured analog signal to generate a first output bit. The controller iteratively processes a residue voltage through the one-bit converter stage a given number of times to form a given number of additional bits. The first output bit and the given number of additional bits form a digital output with the user defined conversion resolution.

An advantageous embodiment also provides a method for converting analog signals to digital signals with dynamically reconfigurable conversion resolution. In this embodiment, an input analog signal is captured by a sample and hold circuit to form a captured analog signal. A number of digital output bits required to generate digital output at a user defined conversion resolution is identified by a controller. A one-bit converter iteratively processes the captured analog signal to generate each output bit in the number of digital output bits.

In another embodiment, an analog to digital converter with dynamically reconfigurable conversion resolution is provided. The analog to digital converter includes an input switch, a sample and hold circuit, a controller, a one-bit converter stage, an analog to digital reference circuit, and a serial clock circuit. The input switch receives an input analog signal. The sample and hold circuit captures the input analog signal to form a captured analog signal. The controller dynamically configures a desired conversion resolution of digital output produced by the analog to digital converter based on a selected conversion resolution. The one-bit converter stage processes the captured analog signal to generate an output bit. The controller iteratively processes a residue voltage through the one-bit converter stage a number of times required to generate a number of digital output bits required to form a digital output having the user defined conversion resolution.

In this embodiment, the single, one-bit converter stage includes a magnitude amplifier, a sync generator, and a serial Gray to binary converter. The analog to digital reference circuit provides a reference voltage. The magnitude amplifier receives the captured analog signal. The magnitude amplifier performs a single bit Gray code conversion using the captured analog signal to form Gray code and a residue voltage. The residue voltage is routed back to the input switch. The sync generator provides a synchronizing signal. The serial Gray to binary converter receives the Gray code from the magnitude amplifier and the synchronized signal from the sync generator. The serial Gray to binary converter converts the Gray code to a binary value using the Gray code and the synchronizing signal. The serial clock circuit provides a serial clock signal to the input switch, the sample and hold circuit.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
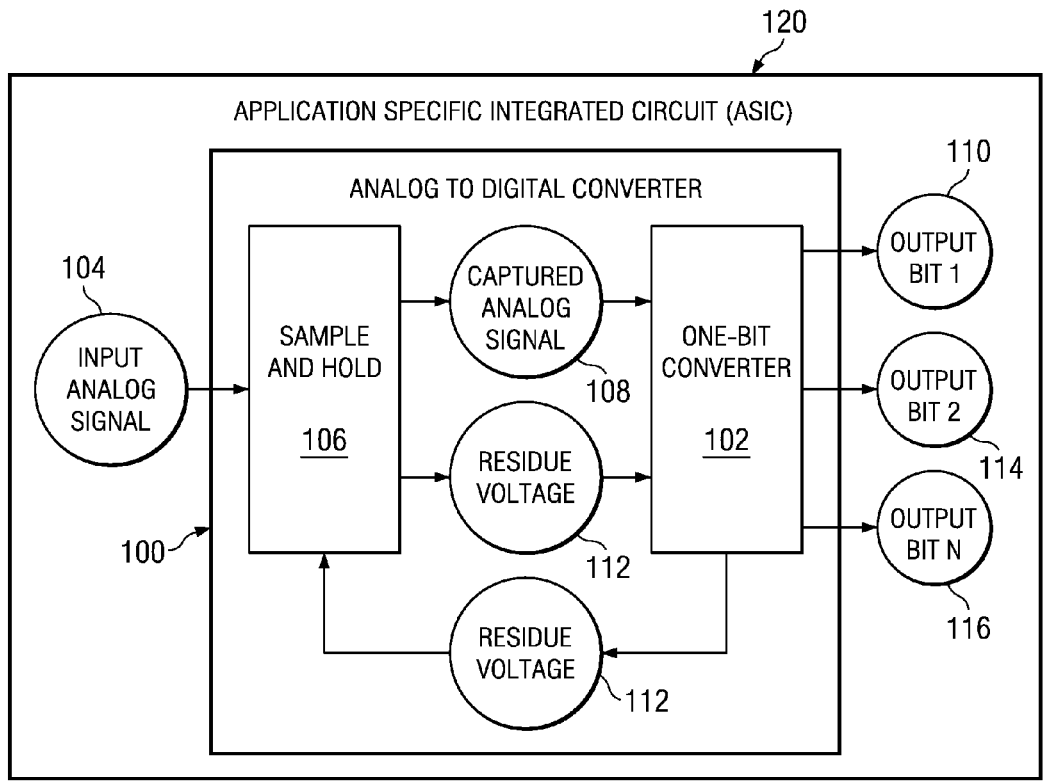
FIG. 1 is a block diagram of an analog to digital converter with dynamically configurable resolution in which an advantageous embodiment may be implemented.

With reference now to the figures and in particular with reference to FIG. 1, an exemplary diagram of an analog to digital converter environment is provided in which illustrative embodiments may be implemented. It should be appreciated that FIG. 1 is only exemplary and is not intended to assert or imply any limitation with regard to the environments in which different embodiments may be implemented. Many modifications to the depicted environment may be made.

Referring now to FIG. 1, a block diagram of an analog to digital converter with dynamically configurable resolution is shown in which an advantageous embodiment may be implemented. Analog to digital converter 100 is an electronic integrated circuit that converts input analog signal 104 into discrete, digital output. Analog to digital converter 100 utilizes a recursive topology of a serial gray folding converter to perform a single bit of data conversion within each baud rate bit period of the serial interface. The upper limit of the serial baud rate is determined by the settling time of the single converter stage implemented by one-bit converter 102.

One-bit converter 102 is a single bit converter stage for converting a sample of analog signal 104 into an output bit. The conversion can be terminated at any arbitrary number of bits. Therefore, the number of conversions/second is equal to the baud rate divided by the number of bits per conversion.

Analog signal 104 is a continuous, analog input signal. Any information may be conveyed by analog signal 104. Sample and hold 106 is a capacitor used to interface analog signal 104 to analog to digital converter 100. Sample and hold 106 stores input analog signal 108. An electronic gate or switch alternately connects and disconnects sample and hold 106 from analog signal 104 to form input analog signal 108. Input analog signal 108 is an analog value. Sample and hold 106 holds captured analog signal 108 steady during the conversion time. The conversion time is the amount of time it takes analog to digital converter 100 to convert a input analog signal 108 into digital output bit 110.

One-bit converter 102 converts input analog signal 108 into output bit 110 and residue voltage 112. A dynamically adjustable conversion resolution indicates the number of output bits that are required to generate a digital representation of the input analog signal 104 with the desired resolution. If the desired resolution requires an additional output bit, residue voltage 112 is routed back to sample and hold 106. Residue voltage 112 is held steady in sample and hold 106 during the subsequent conversion time.

If an additional output bit is required to generate the digital output at the desired conversion resolution, residue voltage 112 is processed through one-bit converter 102 to generate the next output bit 2 114 and a new residue voltage. If the first output bit 1 110 and the next output bit 2 114 is not sufficient to form a digital output with the selected conversion resolution, the new residue voltage is routed back through one-bit converter stage 102 a number of times required to generate the number of output bits, N output bit 116, needed to form the digital output with the selected conversion resolution.

In other words, if an additional output bit is required to obtain output in the selected resolution, the residue voltage is routed to sample and hold 106 and converted into an additional output bit and residue voltage. This process is implemented recursively until the desired number of output bits is generated by one-bit converter 102. Thus, the conversion resolution is easily determined by simply reading out as many bits in the serial data stream as is required to generate digital output with the resolution needed by the application. Analog to digital converter 100 provides a solution to implementing a high speed analog to digital converter that utilizes a minimum amount of electronic circuitry with an easy serial interface.

Application specific integrated circuit 120 is any type of integrated circuit manufactured on a substrate of semiconductor material. For example, application specific integrated circuit 120 may be implemented in, without limitation, a focal plane array (FPA), communication circuitry, telephone circuitry, a temperature sensor circuit, a pressure sensor circuit, a light sensor circuit, a software radio circuit, a telephone circuit, or a voice digitization circuit.

In this example, analog to digital converter 100 is integrated into application specific integrated circuit (ASIC) 120 while consuming minimal silicon resources with minimal power consumption. However, analog to digital converter 100 is not required to be integrated into application specific integrated circuit 120.

Figure 2:
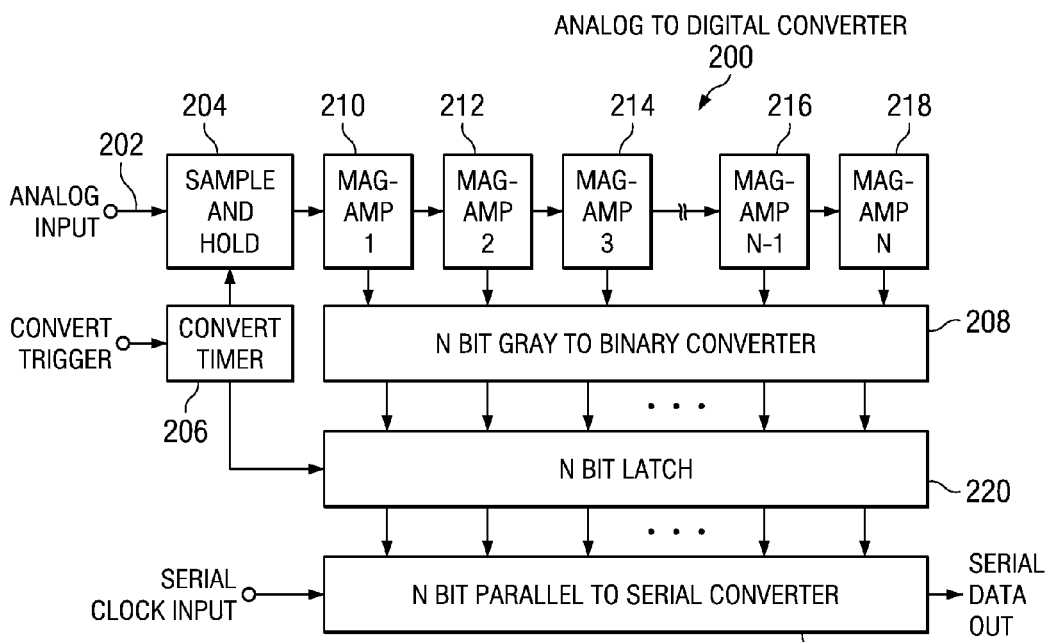
FIG. 2 is a prior art serial gray folding converter.

FIG. 2 is a prior art serial gray folding converter. Analog to digital converter 200 has a topology for a typical, prior art serial gray folding converter with "N" bits of resolution and a serial output interface. Analog input 202 is a continuous, analog signal. Analog input 202 is sampled and held steady by sample and hold 204.

Convert timer 206 generates a convert trigger signal. The convert trigger signal causes sample and hold 204 to capture the analog input voltage. This voltage is presented to the cascade chain of "N" magnitude amplifiers 210-218 for "N" bits of conversion resolution.

The output of the chain of magnitude amplifiers 210-218 is the gray code representation of the sampled analog input voltage. Gray code is a binary numeral system where two successive values differ by only a single digit. For example, a two bit Gray code may comprise the following values: 00; 01; 11; and 10. The Gray code in this example is not limited to two bit Gray code. The Gray code may be implemented as Gray code having any number of bits, such as, without limitation, 3-bit Gray code, 4-bit Gray code, or any other type of Gray code. The gray code is then converted to a binary value by gray to binary converter 208.

Convert timer 206 allows a sufficient delay for the analog residue voltages to propagate through the chain of magnitude amplifiers 210-218 and for the digital output bits to be converted to binary representation by gray to binary converter 208. In other words, the analog residue voltage propagates through a chain of two or more one-bit converter stages to generate the digital output bits.

The binary data is latched by "N" bit latch 220. At the end of the conversion period, the latched binary data is presented to parallel to serial converter 222 for readout as binary serial data output. All serial data output produced by analog to digital converter 200 has a single resolution that cannot be varied or altered without changing the topology of analog to digital converter 200 or replacing parts associated with analog to digital converter 200.

Thus, existing solutions must perform the complete "N" bits of conversion on the analog input before any portion of the output data is valid and available for output. Also, it is necessary to scale the number of converter stages associated with the topology of analog to digital converter 200 to adjust the conversion resolution. Higher resolution converters require more stages, and hence more silicon resources with higher power consumption and longer conversion times.

The embodiments recognize the need for a method and apparatus for an analog to digital converter with dynamically reconfigurable conversion resolution to reduce conversion times, reduce power consumption, and/or reduce the number of single bit converter stages, and subsequently reduce the amount of silicon resources required to generate digital output at a desired conversion resolution.

Therefore, the illustrative embodiments provide a method and apparatus for an analog to digital converter with dynamically reconfigurable conversion resolution. The analog to digital converter comprises a sample and hold circuit, a controller, and a single, one-bit converter stage. The sample and hold circuit holds an input analog signal to form a captured analog signal. The controller determines a number of digital output bits required to generate digital output at a user defined conversion resolution. The one-bit converter stage processes an instance of a captured analog signal to generate a first output bit. The controller iteratively processes a residue voltage through the one-bit converter stage a number of times required to generate additional output bits. The first output bit and the additional output bits form a digital output with the user defined conversion resolution.

Figure 3:
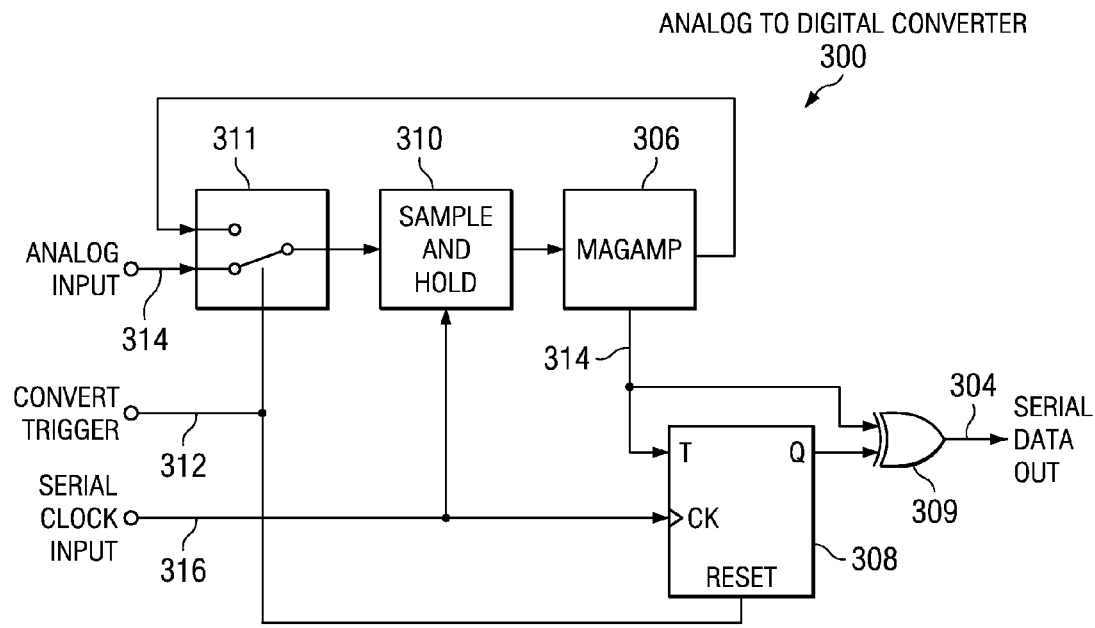
FIG. 3 is a block diagram of a serial output analog to digital converter with "N" bits of resolution in accordance with an advantageous embodiment.

Turning now to FIG. 3, a block diagram of a serial output analog to digital converter with "N" bits of resolution is depicted in accordance with an advantageous embodiment. Analog to digital converter 300 is a device for converting analog input 314 into digital serial data output 304. Analog to digital converter 300 has a topology that utilizes a single converter stage, such as one-bit converter 102 in FIG. 1. The single converter stage includes a single magnitude amplifier 306 along with an analog switch 311, sample and hold 310, and a T flip-flop 308 with an exclusive "or" gate 309. T flip-flop 308 and exclusive "or" gate 309 perform bit-by-bit gray to binary conversion of the output data stream.

The conversion begins when convert trigger 312 generates a convert signal. The convert signal resets T flip-flop gate 308 while allowing analog input 314 voltage to be directed to sample and hold 310 by switch 311. A clock trigger on the serial clock input causes sample and hold 310 to capture analog input 314 and present it to magnitude amplifier 306.

Magnitude amplifier 306 performs the first gray code bit of conversion which is presented to the serial output through exclusive "or" gate 309. If more bits of resolution are desired, the convert signal changes state allowing the residue voltage from magnitude amplifier 306 to be presented to sample and hold 310 through analog switch 311. Subsequent clock trigger on the serial clock input 316 causes the residue voltage to be captured and presented to magnitude amplifier 306 while toggling T flip-flop 308 if the previous gray bit was a "1".

Magnitude amplifier 306 performs the next gray code bit of conversion which is then converted to binary by the exclusive "or" gate 309 and the output of T flip-flop 308, and then presented to the serial data output. When the desired number of conversion data bits is read out, the convert signal again changes state to allow the next conversion of the analog input voltage to begin.

Thus, unlike prior art analog to digital converters, analog to digital converter 300 "loops" the analog residue voltage through the same one-bit converter stage for each subsequent output bit. Therefore the electronic circuitry, silicon resources and power consumption is minimal.

Figure 4:
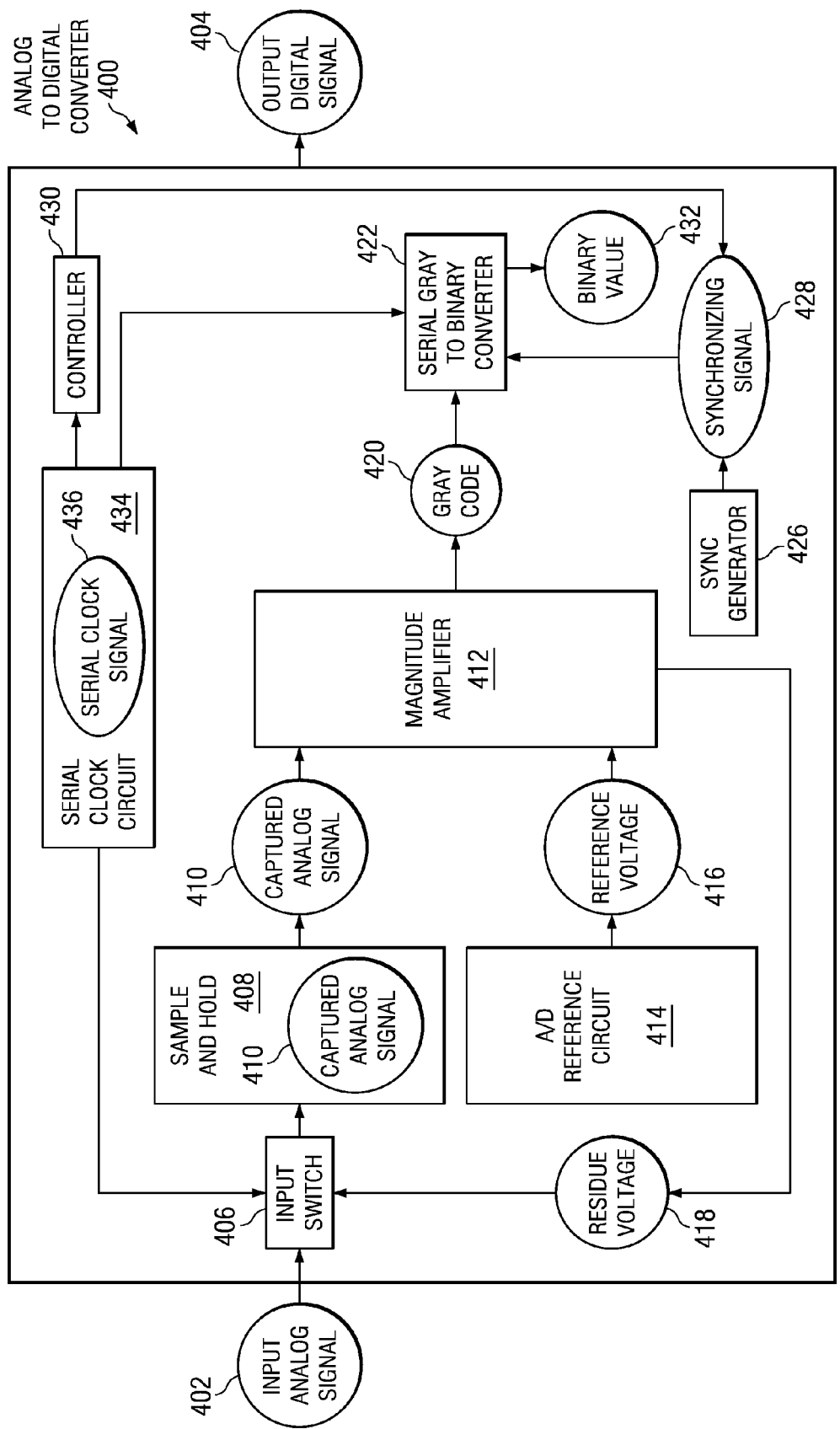
FIG. 4 is a block diagram of a signal flow through an analog to digital converter in accordance with an advantageous embodiment.

FIG. 4 is a block diagram of a signal flow through an analog to digital converter in accordance with an advantageous embodiment. Analog to digital converter 400 is an analog to digital converter with dynamically reconfigurable conversion resolution for converting input analog signal 402 into output digital signal 404, such as input analog to digital converter 300 in FIG. 3.

Input analog signal 402 is a continuous analog signal that is received by input switch 406. Input switch 406 is a device for changing the course or flow of a circuit, such as switch 311 in FIG. 3. Input switch 406 permits input analog signal 402 to flow into sample and hold 408 when input switch 406 is open.

Sample and hold 408 is a circuit that receives, captures, and holds input analog signal 402 to form captured analog signal 410. Magnitude amplifier 412 receives captured analog signal 410 from sample and hold 408.

Analog to digital (A/D) reference circuit 414 generates reference voltage 416. Magnitude amplifier 412 receives reference voltage 416 from analog to digital reference circuit 414. Magnitude amplifier 412 receives and captures captured analog signal 410 and reference voltage 416. Magnitude amplifier 412 performs a single bit Gray code conversion on captured analog signal 410 to generate residue voltage 418 and Gray code 420. Residue voltage 418 is routed back to input switch 406. Gray code 420 is routed to serial Gray to binary converter 422.

Sync generator 426 provides synchronizing signal 428 to serial Gray to binary converter 422. Serial Gray to binary converter 422 is a circuit for converting Gray code 420 into binary value 432. Serial Gray to binary converter 422 receives Gray code 420 from magnitude amplifier 412 and synchronizing signal 428 from sync generator 426. Serial Gray to binary converter 422 then converters Gray code 420 into binary value 432. Synchronizing signal 428 is also used by the input switch 406 to control the selection of the input analog input 402 or residue voltage 418. Synchronizing signal 428 starts the conversion by selecting input analog signal 402 and resetting the T flip-flop in Gray to binary converter 422.

Serial clock circuit 434 provides serial clock signal 436 to input switch 406, sample and hold 408, and serial Gray to binary converter 422. Serial clock signal 436 is used to coordinate or synchronize the actions of multiple circuits.

Controller 430 is a device for dynamically configuring desired conversion resolutions. Controller 430 loops residue voltage 418 through the same one-bit converter stage for each subsequent output bit to control the conversion resolution of output digital signal 404. The greater the number of bits in output digital signal 404, the greater the resolution of output digital signal 404.

Thus, analog to digital converter 400 uses fewer electronic circuitry components, consumes less power, and requires less physical die area of an application specific integrated circuit. The analog to digital conversion latency is shorter than existing designs, and the conversion resolution and sample rate can be dynamically varied.

Figure 5:
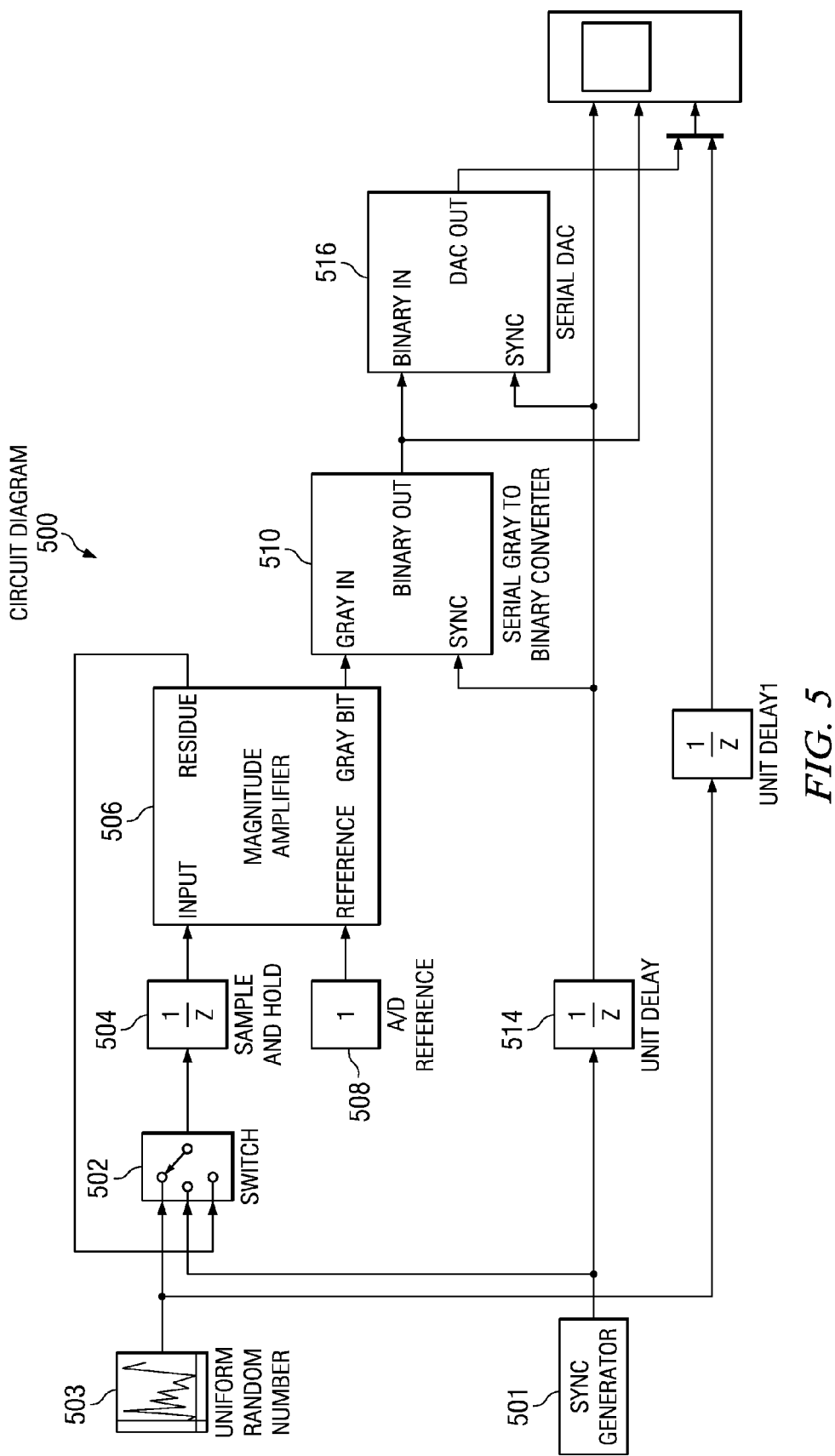
FIG. 5 is a circuit diagram illustrating a topology for an analog to digital converter in accordance with an advantageous embodiment.

Turning now to FIG. 5, a circuit diagram illustrating a topology for an analog to digital converter is shown in accordance with an advantageous embodiment. Circuit diagram 500 illustrates an analog to digital converter with dynamically adjustable conversion resolution, such as analog to digital converter 400 in FIG. 4.

Sync generator 501 produces a synchronizing signal which begins a conversion. Switch 502 is an input switch, such as input switch 406 in FIG. 4. Switch 502 selects the random analog voltage to be converted from the uniform random number generator 503. This voltage is then captured by sample and hold 504.

Magnitude amplifier 506 performs the single bit Gray code conversion of the sampled voltage, and the residue voltage is routed back to switch 502. Analog to digital (A/D) reference 508 generates a reference voltage and sends the reference voltage to magnitude amplifier 506. Magnitude amplifier 506 uses the reference voltage and the sample voltage to generate the Gray code and a residue voltage.

At the next clock cycle when sync generator 501 output goes low, switch 502 selects the residue voltage for sample and hold. Magnitude amplifier 506 then performs a conversion of the residue voltage during each subsequent clock cycle.

Serial Gray to binary converter 510 performs a serial, bit by bit conversion of the Gray code output from magnitude amplifier 506 into a binary format. Because sample and hold 504 element delays the Gray code output of magnitude amplifier by one clock cycle, unit delay 514 is introduced on the output of sync generator 501 so that the sync signal arrives at serial Gray to binary converter 510 at the same time as the first Gray code bit from magnitude amplifier 506. For the purpose of demonstration, serial digital to analog converter 516 block has been included to show that the binary out signal represents the converted analog voltage.

Figure 6:
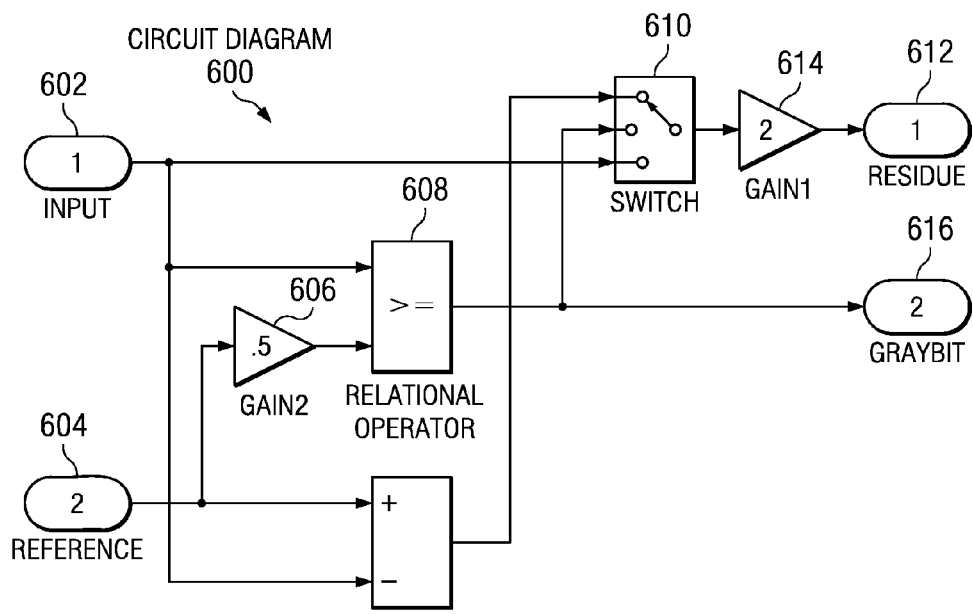
FIG. 6 is a circuit diagram illustrating a topology of a magnitude amplifier in accordance with an advantageous embodiment.

FIG. 6 is a circuit diagram illustrating a topology of a magnitude amplifier in accordance with an advantageous embodiment. Circuit diagram 600 is a magnitude amplifier, such as magnitude amplifier 312 in FIG. 3. The magnitude amplifier receives an input analog signal 602 from a sample and hold circuit. The magnitude amplifier also receives reference threshold voltage 604 from an analog to digital reference circuit, such as analog to digital (A/D) reference circuit 314 in FIG. 3.

Gain2 606 is a gain of 0.5 amplifier. Gain2 606 increases a signal amplitude by a ratio of 0.5 of output to input. Relational operator 608 compares signal values. Arithmetic operator 609 subtracts the value of input signal 602 from reference threshold voltage 604. If a signal value of input 602 is greater than or equal to one half the value of reference threshold voltage 604, the relational operator 608 generates a boolean true signal which produces a "1" for the gray code bit output 614, and causes switch 610 to select the output of arithmetic operator 609. A signal value of input 602 which is less than one half of the threshold voltage causes relational operator 608 to output a boolean false signal which produces a "0" for gray code bit output 614, and causes switch 610 to select input signal 602.

Depending on the boolean output of relational operator 608, switch 610 selects either input signal 602 or the processed signal from arithmetic operator 609 to send to Gain 1 614. Gain1 614 is a gain of two amplifier. Gain1 614 has a 2.0 ratio of output to input increase in signal amplitude of residue voltage 612 produced by the magnitude amplifier. Magnitude amplifier 600 generates Gray code bit (graybit) 616 and residue voltage 612.

Figure 7:
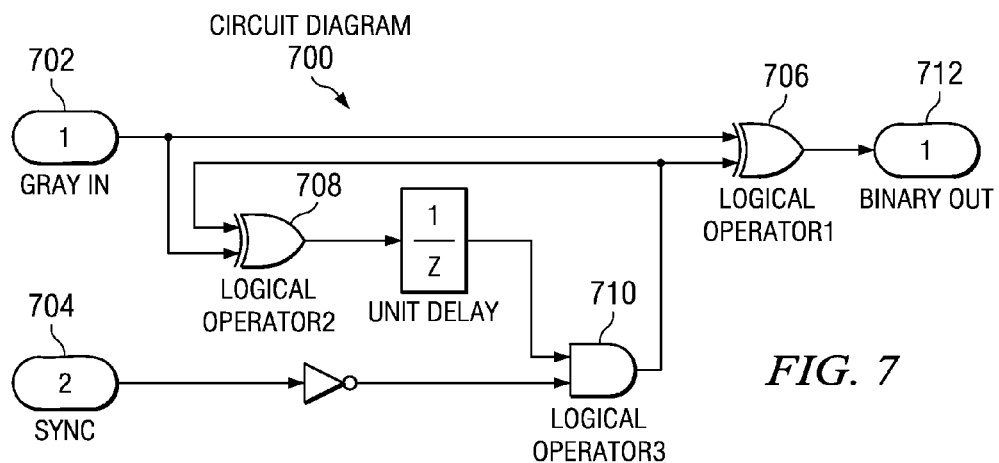
FIG. 7 is a circuit diagram illustrating a topology of a serial gray to binary converter in accordance with an advantageous embodiment.

FIG. 7 is a circuit diagram illustrating a topology of a serial gray to binary converter in accordance with an advantageous embodiment. Circuit diagram 700 is a representation of a serial Gray to binary converter, such as serial Gray to binary converter 422 in FIG. 4. The serial Gray to binary converter receives input Gray code 702 from a magnitude amplifier. The serial Gray to binary converter also receives a synchronizing signal 704 from a sync generator.

Logical operator 1 706 and logical operator 2 708 are exclusive "or" logical operators. Logical operators 704 and 706 performs a logical operations on two operands and produces a "true" result only if exactly one of the two operands has a value of true. Logical operator 3 710 is an "and" logical operator. Logical operator 3 710 returns a "true" result if both operands has a value of true. Thus, the serial Gray to binary converter generates binary output 712 using input Gray code 702 and synchronizing signal 704.

Figure 8:
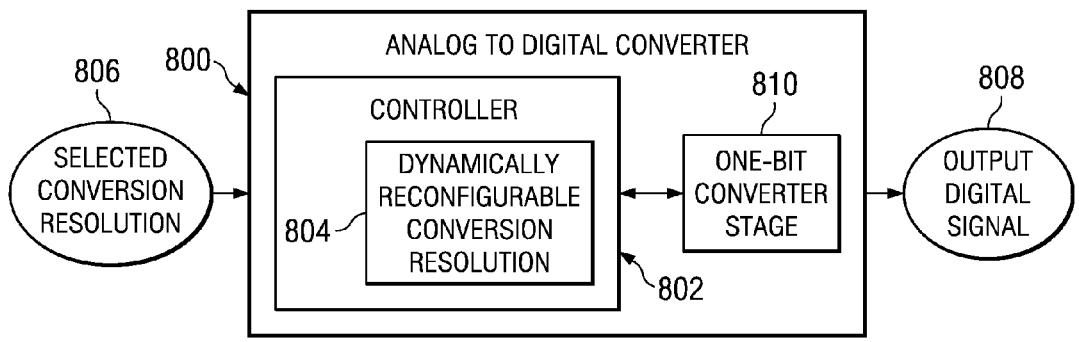
FIG. 8 is a block diagram of a dynamically reconfigurable conversion resolution controller in accordance with an advantageous embodiment.

Referring now to FIG. 8, a block diagram of a dynamically reconfigurable conversion resolution controller is shown in accordance with an advantageous embodiment. The dynamically configurable conversion resolution is adjusted by reading out as many bits in the serial data stream as is required by the application. Controller 802 determines the number of bits in the serial data stream that is required by the application to produce output digital signal 808 in dynamically reconfigurable conversion resolution 804.

Controller 802 dynamically changes the dynamically reconfigurable conversion resolution 804 based on selected conversion resolution 806. Selected conversion resolution 806 is a user defined conversion resolution. Controller 802 loops the analog residue voltage through the same one-bit converter stage 810 for each subsequent output bit to produce output digital signal 808 with the selected conversion resolution 806. Thus, dynamically reconfigurable conversion resolution 804 associated with output digital signal 808 is modified based on selected conversion resolution without altering the topology of analog to digital converter 800, without replacing analog to digital converter 800, and without replacing any parts associated with analog to digital converter 800.

Figure 9:
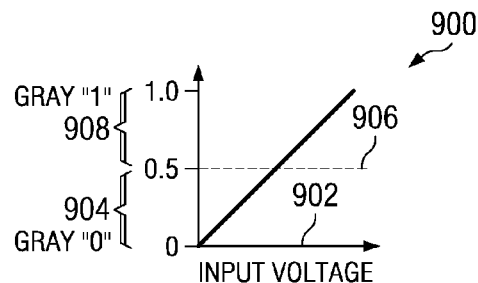
FIG. 9 is a graph illustrating a threshold for producing Gray bits in a magnitude amplifier for producing Gray bits in accordance with an advantageous embodiment.
Figure 10:
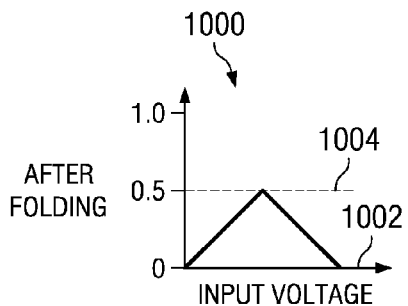
FIG. 10 is a graph illustrating processing of the input voltage in accordance with an advantageous embodiment.
Figure 11:
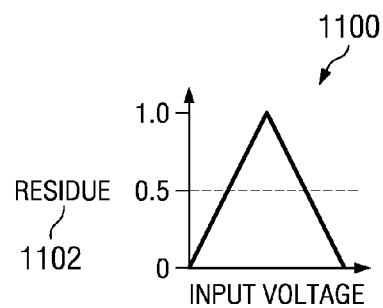
FIG. 11 is a graph illustrating residue output voltage of a magnitude amplifier in accordance with an advantageous embodiment.

FIGS. 9-11 illustrates the operation of a unipolar magnitude amplifier, such as magnitude amplifier 310 in FIG. 3. Turning now to FIG. 9, a graph illustrating a threshold for producing Gray bits in a magnitude amplifier in accordance with an advantageous embodiment. The input to a magnitude amplifier is a voltage signal ranging from 0 to 1 (full scale). The magnitude amplifier produces a boolean Gray code bit and a residue voltage signal determined by input voltage signal 902. Graph 900 shows the range of input voltage 902 where the input voltage produces a Gray bit "0" 904 if it is below threshold 906, and a Gray bit "1" 908 if the input voltage is above the threshold. Threshold 906 is set to ½ of the full scale.

FIG. 10 is a graph illustrating processing of the input voltage in accordance with an advantageous embodiment. Graph 1000 shows the processing of input voltage 1002 such that an input voltage above threshold 1004 value is "folded" about the threshold axis value.

Turning now to FIG. 11, a graph illustrating residue output voltage of a magnitude amplifier is depicted in accordance with an advantageous embodiment. Graph 1100 shows residue output voltage 1102 of the magnitude amplifier which is the folded and processed voltage multiplied by a factor of 2.

Figure 12:
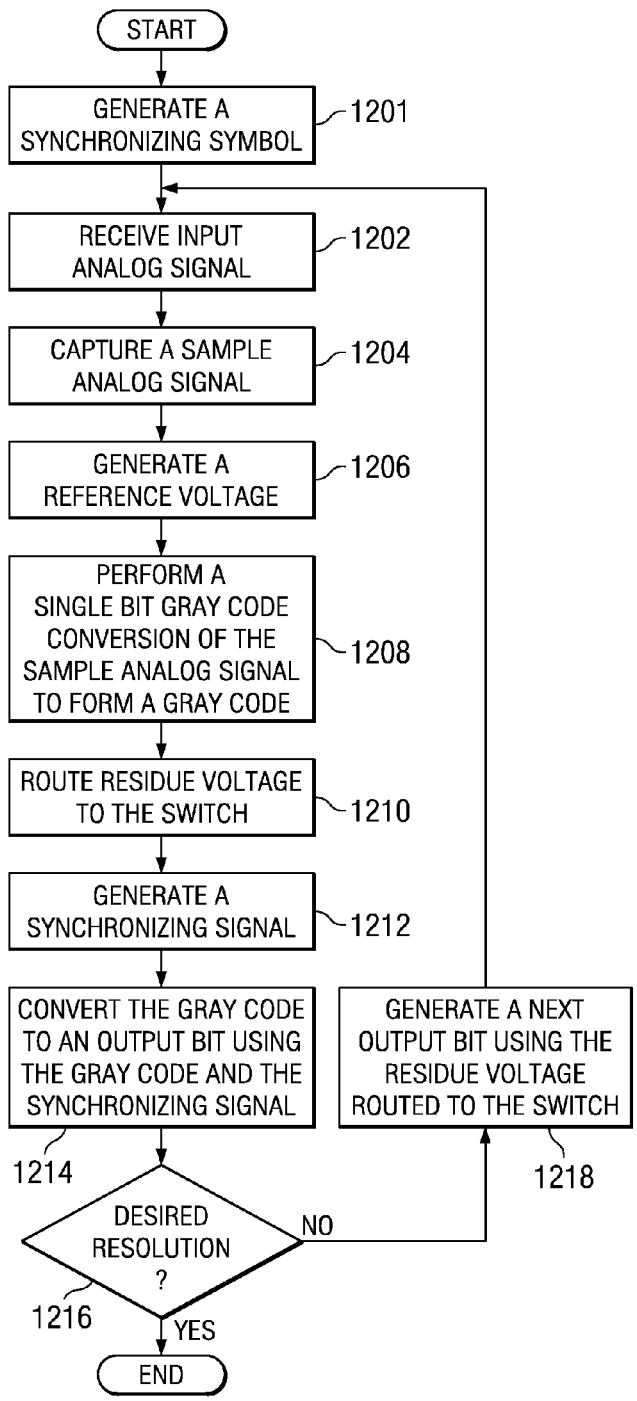
FIG. 12 is a flowchart illustrating a process for converting an analog signal to a digital signal in accordance with an advantageous embodiment.

FIG. 12 is a flowchart illustrating a process for converting an analog signal to a digital signal in accordance with an advantageous embodiment. The process in FIG. 12 is implemented by an analog to digital converter, such as analog to digital converter 100 in FIG. 1, analog to digital converter 300 in FIG. 3, or analog to digital converter 400 in FIG. 4.

The process begins when a controller generates a synchronizing signal (operation 1201). This signal causes the analog switch to receive an input analog signal (operation 1202). The synchronizing signal also initializes the serial Gray-to-binary converter. The process captures a sample input analog signal (operation 1204). The process generates a reference voltage (operation 1206). The process performs a single bit Gray code conversion of the sample analog signal to form a Gray code (operation 1208). The process routes the residue voltage to the switch (operation 1210).

The process generates a synchronizing signal (operation 1212). The process converts the Gray code to an output bit using the Gray code and the synchronizing signal (operation 1214). The controller makes a determination as to whether a number of bits required for a desired resolution have been generated (operation 1216). If the desired resolution has been reached, the process terminates thereafter. If the desired resolution has not been reached at operation 1216, the process generates a next output bit using the residue voltage routed to the switch (operation 1218). The process iteratively performs operations 1202-1218 until the number of bits needed to reach the desired resolution has been generated.

Figure 13:
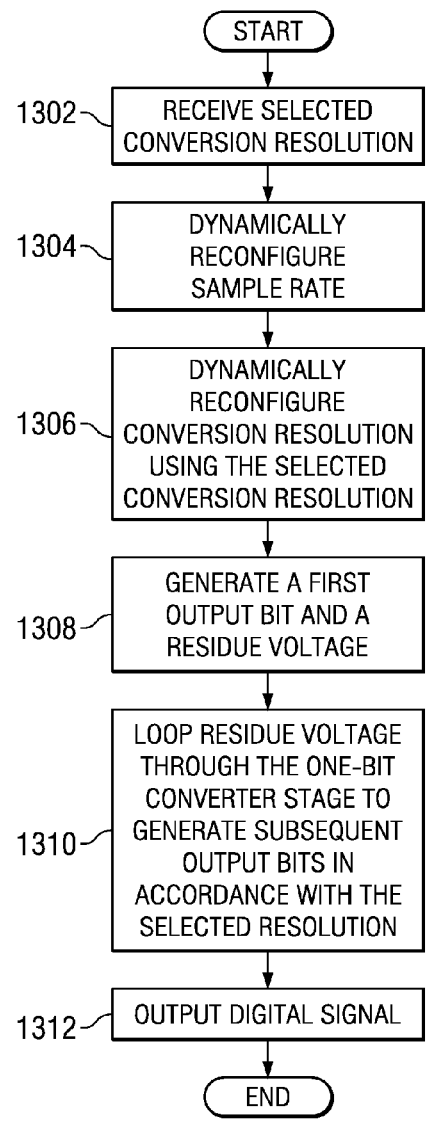
FIG. 13 is a flowchart illustrating a process for dynamically reconfiguring conversion resolution in an analog to digital converter in accordance with an advantageous embodiment.

FIG. 13 is a flowchart illustrating a process for dynamically reconfiguring conversion resolution in an analog to digital converter in accordance with an advantageous embodiment. The process in FIG. 13 is implemented by an analog to digital converter, such as analog to digital converter 100 in FIG. 1, analog to digital converter 300 in FIG. 3, or analog to digital converter 400 in FIG. 4.

The process receives a selected conversion resolution (operation 1302). The process dynamically reconfigures the sample rate (operation 1304). The process dynamically reconfigures conversion resolution using the selected conversion (operation 1306). The process generates a first output bit and a residue voltage (operation 1308). The process loops the residue voltage through the one-bit converter stage to generate subsequent output bits in accordance with the selected resolution (operation 1310). The process outputs the digital signal at the selected conversion resolution (operation 1312) with the process terminating thereafter.

Figure 14:
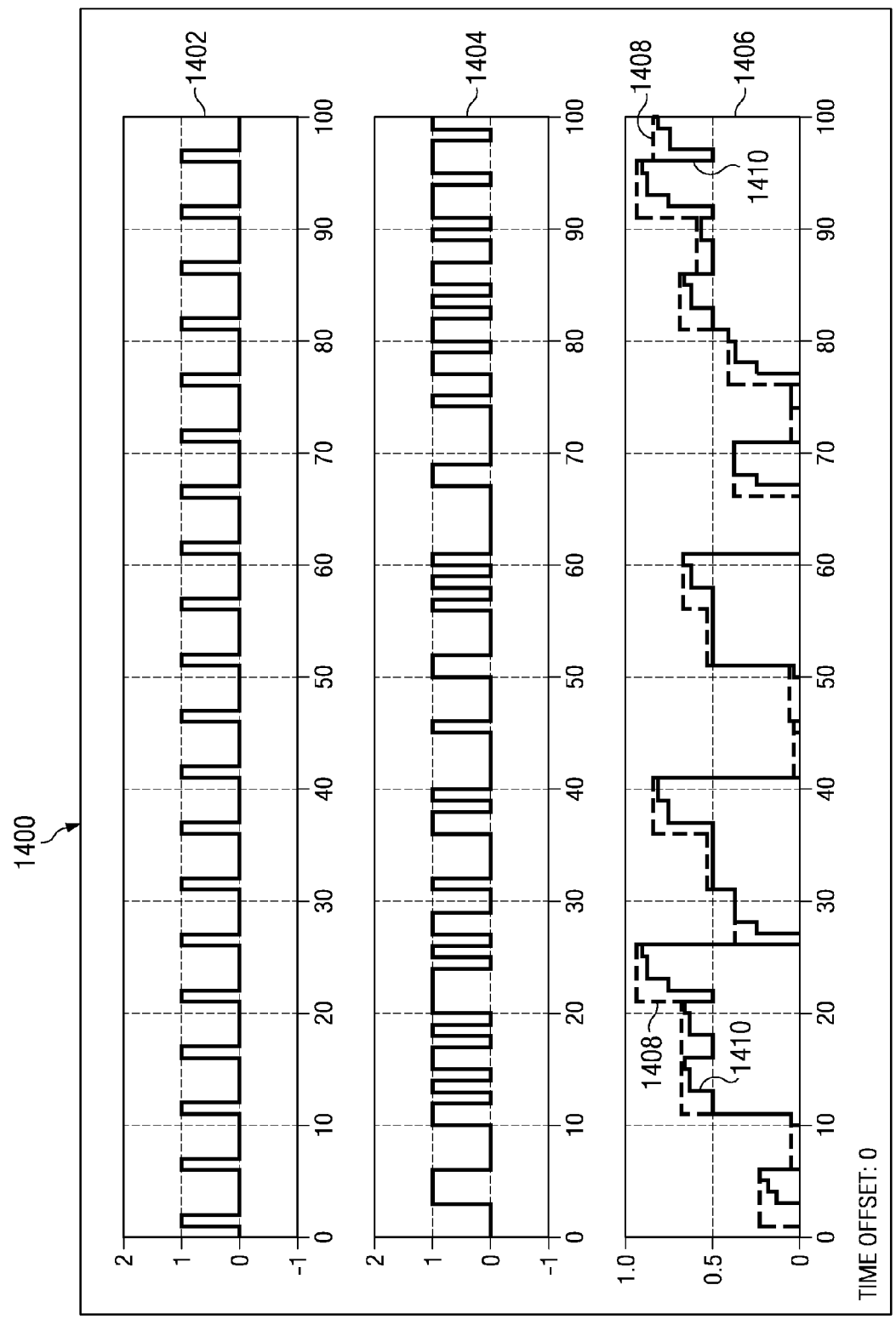
FIG. 14 is a graph illustrating output voltage from an analog to digital converter in accordance with an advantageous embodiment.

Referring now to FIG. 14, a graph illustrating output voltage from an analog to digital converter is shown in accordance with an advantageous embodiment. Graph 1400 shows waveforms of conversion pulses in an analog to digital converter. Trace 1402 shows the conversion pulses which, in this example, occur every 5 clock cycles giving 5 bits of resolution for each conversion. Trace 1404 shows the serial binary conversion data. As each binary serial bit is received by the serial digital to analog converter, the analog output of the digital to analog converter settles to a value with greater and greater resolution.

Trace 1406 shows the random analog voltage presented to the analog to digital converter at line 1408, and the matching output of the digital to analog converter at line 1410. It can be seen that the digital to analog converter output voltage asymptotically approaches each sampled input voltage.

Figure 15:
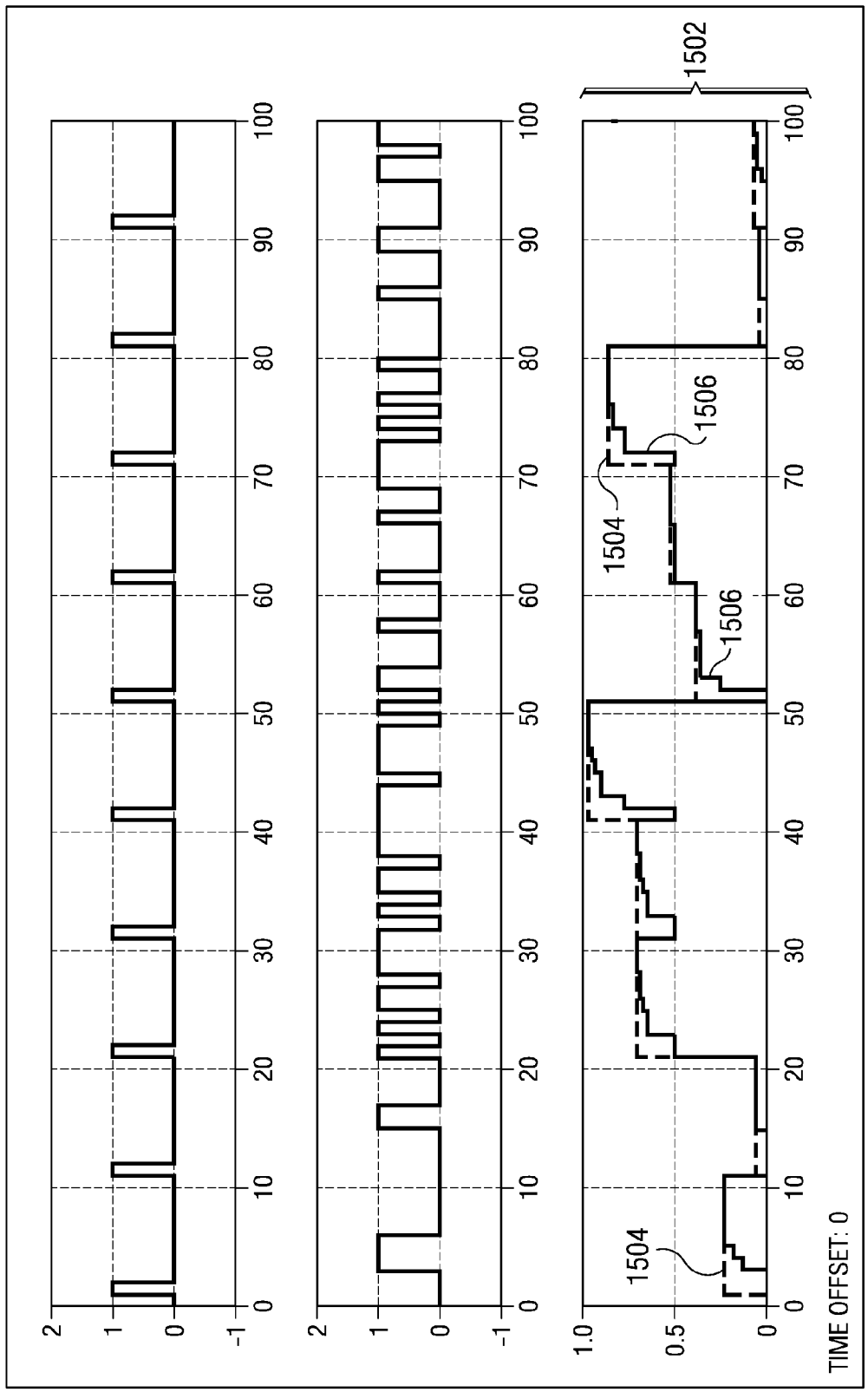
FIG. 15 is a graph illustrating output voltage at a different resolution in accordance with an advantageous embodiment.

The only alteration needed to change the number of bits of resolution of this analog to digital converter is to allow more clock cycles between sync pulses. FIG. 15 is a graph illustrating output voltage at a different resolution in accordance with an advantageous embodiment. FIG. 15 shows the same setup as FIG. 14 except that the analog to digital conversion utilizes 10 clock cycles per conversion instead of 5 clock cycles per conversion.

Trace 1502 shows the random analog voltage presented to the analog to digital converter at line 1504 and the matching output of the digital to analog converter at line 1506. The digital to analog converter output voltage asymptotically approaches each sampled input voltage.

Thus, an embodiment of the present disclosure provides an analog to digital converter with dynamically reconfigurable conversion resolution. The analog to digital converter comprises a sample and hold circuit, a controller, and a single, one-bit converter stage. The sample and hold circuit holds an input analog signal to form a captured analog signal. The controller determines a number of digital output bits required to generate digital output at a user defined conversion resolution. The one-bit converter stage processes an instance of a captured analog signal to generate an output bit. The controller iteratively processes a residue voltage through the one-bit converter stage a number of times required to generate the number of digital output bits to form a digital output with the user defined conversion resolution.

Thus, the illustrative embodiments provide a topology for a serial output, analog to digital converter with theoretically infinite resolution that can be dynamically adjusted without replacing parts associated with the analog to digital converter. The process performs the function of analog to digital conversion of an input voltage to any desired resolution with low latency. The process also provides the digital output in a serial data stream with a minimum amount of circuitry and with minimum power consumption. In addition, analog to digital converters can be fabricated using less silicon die area with lower power consumption.

The analog to digital converter of the advantageous embodiments may be implemented to generate digital output with dynamically reconfigurable conversion resolution in any type of device, circuitry, or application for analog to digital conversion. For example, the dynamically reconfigurable analog to digital converter may be used in software radio, telephone devices, communications circuitry, voice digitization technology, light sensors, imaging sensors, pressure sensors, temperature sensors, or any other analog to digital converter applications.

The circuits as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An analog to digital converter with dynamically reconfigurable conversion resolution, the analog to digital converter comprising:
   a sample and hold circuit, wherein the sample and hold circuit holds an input analog signal to form a captured analog signal;
   a controller, wherein the controller determines a number of digital output bits required to generate digital output at a user defined conversion resolution, and wherein the controller iteratively processes an analog residue voltage through a one-bit converter stage to generate the number of digital output bits required to generate digital output at the user defined conversion resolution; and
   the one-bit converter stage, wherein the one-bit converter stage generates a first output bit in response to processing the captured analog signal, and wherein the one-bit converter stage iteratively processes the analog residue voltage a given number of times to form a given number of additional bits, wherein the first output bit and the given number of additional bits form a digital output with the user defined conversion resolution.

2. The analog to digital converter of claim 1 wherein the one-bit converter stage comprises:
   a single magnitude amplifier, wherein the magnitude amplifier receives the captured analog signal, and wherein the magnitude amplifier performs a single bit Gray code conversion using the captured analog signal to form Gray code and a residue voltage.

3. The analog to digital converter of claim 1 wherein the one-bit converter stage comprises:
   a serial Gray to binary converter, wherein the serial Gray to binary converter converts the Gray code to an output bit.

4. The analog to digital converter of claim 1 wherein the one-bit converter stage further comprises:
   an analog to digital reference circuit, wherein the analog to digital reference circuit provides a reference voltage.

5. The analog to digital converter of claim 1 wherein the one-bit converter stage further comprises:
   a sync generator, wherein the sync generator provides a synchronizing signal.

6. The analog to digital converter of claim 1 further comprising:
   an input switch, wherein the input switch receives the input analog signal.

7. The analog to digital converter of claim 1 further comprising:
   a serial clock circuit, wherein the serial clock circuit provides a serial clock signal to the input switch, the sample and hold circuit, and the serial Gray to binary converter.

8. The analog to digital converter of claim 1 wherein the analog to digital converter is integrated into an application specific integrated circuit.

9. The analog to digital converter of claim 1 wherein the sample and hold circuit holds the input analog signal steady during a conversion time, wherein the conversion time is an amount of time required to convert the captured analog signal into a digital output signal.

10. The analog to digital converter of claim 1 wherein the selected conversion resolution is dynamically adjustable, and wherein a conversion resolution of the digital output is altered without altering a topology of the analog to digital converter.

11. A method for converting analog signals to digital signals with dynamically reconfigurable conversion resolution, the method comprising:
    capturing an input analog signal by a sample and hold circuit to form a captured analog signal;
    identifying a number of digital output bits required to generate digital output at a user defined conversion resolution by a controller;
    iteratively processing the captured analog signal through a single, one-bit converter to generate each output bit in the number of digital output bits;
    iteratively processing a residue voltage through the one-bit converter stage a number of times; and
    generating the number of digital output bits by the one-bit converter stage to form a digital output with the user defined conversion resolution.

12. The method of claim 11 wherein processing an instance of a sampled analog signal through the one-bit converter stage generates an output bit.

13. The method of claim 11 further comprising:
    receiving the captured analog signal by a magnitude amplifier; and
    performing a single bit Gray code conversion using the captured analog signal to form Gray code and a residue voltage.

14. The method of claim 13 further comprising:
    converting the Gray code to an output bit by a serial Gray to binary converter.

15. The method of claim 11 further comprising:
    generating a reference voltage by an analog to digital reference circuit.

16. The method of claim 11 wherein the selected conversion resolution is dynamically adjustable, and wherein a conversion resolution of the digital output is altered without altering a topology of the analog to digital converter.

17. The method of claim 9 further comprising:
generating, by a serial clock circuit, a serial clock signal to the input switch, the sample and hold circuit, and the serial Gray to binary converter.

18. An analog to digital converter with dynamically reconfigurable conversion resolution, the analog to digital converter comprising:
an input switch, wherein the input switch receives an input analog signal;
a sample and hold circuit, wherein the sample and hold circuit captures the input analog signal to form a captured analog signal;
a controller, wherein the controller dynamically configures a desired conversion resolution of digital output produced by the analog to digital converter based on a selected conversion resolution; and
a one-bit converter stage, wherein processing an instance of a captured analog signal through the one-bit converter stage generates an output bit, and wherein the controller iteratively processes a residue voltage through the one-bit converter stage a number of times required to generate a number of digital output bits required to form a digital output having the user defined conversion resolution, and wherein the single, one-bit converter stage comprises:
an analog to digital reference circuit, wherein the analog to digital reference circuit provides a reference voltage;
a magnitude amplifier, wherein the magnitude amplifier receives the captured analog signal, and wherein the magnitude amplifier performs a single bit Gray code conversion using the captured analog signal to form Gray code and a residue voltage, wherein the residue voltage is routed back to the input switch;
a sync generator, wherein the sync generator provides a synchronizing signal;
a serial Gray to binary converter, wherein the serial Gray to binary converter receives the Gray code from the magnitude amplifier and the synchronized signal from the sync generator, and wherein the serial Gray to binary converter converts the Gray code to a binary value using the Gray code and the synchronizing signal; and
a serial clock circuit, wherein the serial clock circuit provides a serial clock signal to the input switch, the sample and hold circuit, and the serial Gray to binary converter.

19. The analog to digital converter of claim 18 wherein the selected conversion resolution is dynamically adjustable, and wherein a conversion resolution of the digital output is altered without altering a topology of the analog to digital converter.

* * * * *